US012794472B2

(12) United States Patent
Lin et al.

(10) Patent No.: US 12,794,472 B2
(45) Date of Patent: Nov. 10, 2026

(54) INTERFACE DEVICE AND DYNAMIC TRACKING BIAS CIRCUIT

(71) Applicant: MEDIATEK INC., Hsinchu City (TW)

(72) Inventors: Yu-Shen Lin, Hsinchu City (TW); Jui-Ming Chen, Hsinchu City (TW); Federico Agustin Altolaguirre, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 163 days.

(21) Appl. No.: 18/615,088

(22) Filed: Mar. 25, 2024

(65) Prior Publication Data

US 2024/0364339 A1 Oct. 31, 2024

Related U.S. Application Data

(60) Provisional application No. 63/498,558, filed on Apr. 27, 2023.

(51) Int. Cl.
*H03K 19/0185* (2006.01)
*H03K 17/08* (2006.01)

(52) U.S. Cl.
CPC ..... *H03K 19/018521* (2013.01); *H03K 17/08* (2013.01)

(58) Field of Classification Search
CPC ....................... H03K 19/018521; H03K 17/08
USPC ........................................................... 361/56
See application file for complete search history.

(56) References Cited

U.S. PATENT DOCUMENTS 11,422,581 B2 8/2022 Dey
2005/0156636 A1* 7/2005 Makishima .... H03K 19/018521 327/112
2007/0052445 A1* 3/2007 Wu ........................ H03K 3/356 326/81
2015/0062761 A1 3/2015 Chen
2022/0231686 A1* 7/2022 Lee ................ H03K 19/018521

FOREIGN PATENT DOCUMENTS

CN 1357973 A 7/2002
JP 2005184770 A 7/2005
JP 2010021712 A 1/2010

OTHER PUBLICATIONS

Extended European Search Report dated Sep. 30, 2024, issued in application No. EP 24172553.0.
Chinese language office action dated Dec. 18, 2024, issued in application No. TW 113115729.
English language communication dated Sep. 21, 2026, issued in application No. EP 24 172 553.0.

* cited by examiner

*Primary Examiner* — Crystal L Hammond
*Assistant Examiner* — Samantha L Faubert
(74) *Attorney, Agent, or Firm* — McClure, Qualey & Rodack, LLP

(57) ABSTRACT

An interface device includes a dynamic tracking bias circuit, an ESD (Electrostatic Discharge) clamp circuit, a pre-driver, a post-driver, and an I/O (Input/Output) pad. The dynamic tracking bias circuit provides a first supply voltage. The first supply voltage is determined according to a main power voltage and a second supply voltage. The ESD clamp circuit limits the second supply voltage. The post-driver is driven by the pre-driver. The I/O pad is driven by the post-driver. The pre-driver and the post-driver are supplied by the main power voltage, the first supply voltage, and the second supply voltage.

17 Claims, 3 Drawing Sheets

INTERFACE DEVICE AND DYNAMIC TRACKING BIAS CIRCUIT

CROSS REFERENCE TO RELATED APPLICATIONS

This application claims the benefit of U.S. Provisional Application No. 63/498,558, filed on Apr. 27, 2023, the entirety of which is incorporated by reference herein.

BACKGROUND OF THE INVENTION

Field of the Invention

The disclosure generally relates to an interface device, and more specifically, to an interface device and a dynamic tracking bias circuit therein.

Description of the Related Art

An interface device is used to receive an input voltage or output an output voltage. However, the interface device should be supplied by so many voltages from an external device, and it may increase the circuit complexity and the manufacturing cost. Accordingly, there is a need to propose a novel solution for solving the problem of the prior art.

BRIEF SUMMARY OF THE INVENTION

In an exemplary embodiment, the disclosure is directed to an interface device that includes a dynamic tracking bias circuit, an ESD (Electrostatic Discharge) clamp circuit, a pre-driver, a post-driver, and an I/O (Input/Output) pad. The dynamic tracking bias circuit provides a first supply voltage. The first supply voltage is determined according to the main power voltage and the second supply voltage. The ESD clamp circuit limits the second supply voltage. The post-driver is driven by the pre-driver. The I/O pad is driven by the post-driver. The pre-driver and the post-driver are supplied by the main power voltage, the first supply voltage, and the second supply voltage.

In some embodiments, the main power voltage and the second supply voltage are from an external PMIC (Power Management Integrated Circuit).

In some embodiments, the first supply voltage is not limited by any ESD clamp circuit.

In some embodiments, the first supply voltage is substantially equal to the main power voltage minus the second supply voltage.

In some embodiments, the dynamic tracking bias circuit includes a level shifter and an output driver. The level shifter generates the first supply voltage according to the main power voltage and the second supply voltage. The output driver provides a driving capability according to the first supply voltage.

In some embodiments, the level shifter of the dynamic tracking bias circuit includes a first transistor and a first resistor. The first transistor has a control terminal coupled to a first node, a first terminal coupled to the second supply voltage, and a second terminal coupled to the first node. The first resistor has a first terminal coupled to the first node, and a second terminal coupled to a ground voltage.

In some embodiments, the level shifter of the dynamic tracking bias circuit further includes a second transistor and a third transistor. The second transistor has a control terminal coupled to the first node, a first terminal coupled to the second supply voltage, and a second terminal coupled to a second node. The third transistor has a control terminal coupled to the second node, a first terminal coupled to the ground voltage, and a second terminal coupled to the second node.

In some embodiments, the level shifter of the dynamic tracking bias circuit further includes a fourth transistor, a fifth transistor, and a second resistor. The fourth transistor has a control terminal coupled to the second node, a first terminal coupled to the ground voltage, and a second terminal coupled to a supply node. The second resistor has a first terminal coupled to a third node, and a second terminal coupled to the supply node. The fifth transistor has a control terminal coupled to the third node, a first terminal coupled to the main power voltage, and a second terminal coupled to the third node. The supply node is arranged to output the first supply voltage to the output driver.

In some embodiments, the first transistor, the second transistor, and the fifth transistor have the same transistor sizes.

In some embodiments, each of the first transistor, the second transistor, and the fifth transistor is implemented with a PMOSFET (P-type Metal-Oxide-Semiconductor Field-Effect Transistor).

In some embodiments, the third transistor and the fourth transistor have the same transistor sizes.

In some embodiments, each of the third transistor and the fourth transistor is implemented with an NMOSFET (N-type Metal-Oxide-Semiconductor Field-Effect Transistor).

In another exemplary embodiment, the invention is directed to a dynamic tracking bias circuit that includes a level shifter and an output driver. The level shifter generates a first supply voltage according to the main power voltage and a second supply voltage. The output driver provides a driving capability according to the first supply voltage. The first supply voltage is substantially equal to the main power voltage minus the second supply voltage.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention will be described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be made through a direct electrical connection, or through an indirect electrical connection via other devices and connections.

Figure 1:
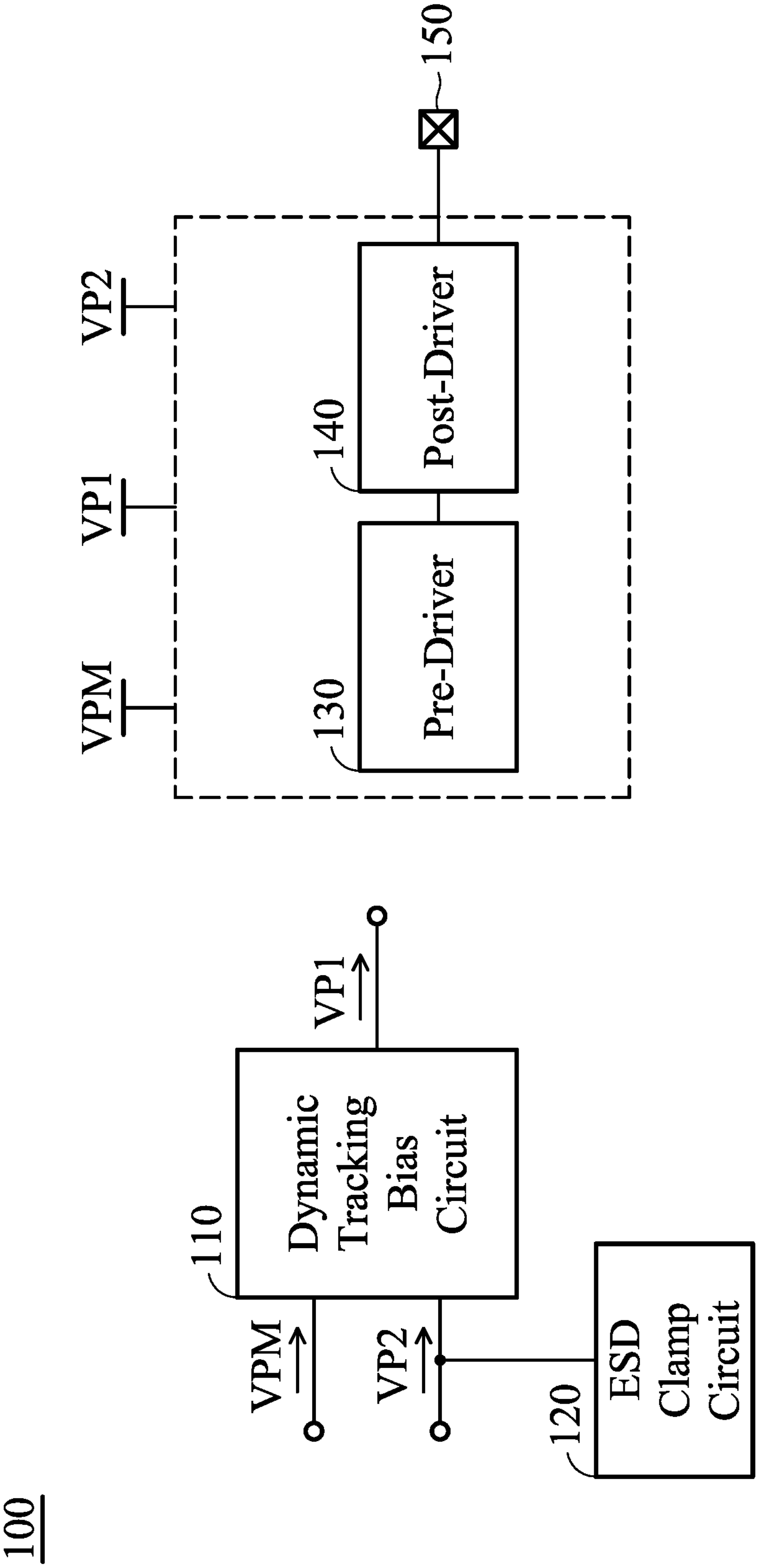
FIG. 1 is a diagram of an interface device according to an embodiment of the invention.

FIG. 1 is a diagram of an interface device 100 according to an embodiment of the invention. The interface device 100 may be applied to an IC (Integrated Circuit) or a mobile platform, such as a smart phone, a tablet computer, or a notebook computer. As shown in FIG. 1, the interface device 100 includes a dynamic tracking bias circuit 110, an ESD (Electrostatic Discharge) clamp circuit 120, a pre-driver 130, a post-driver 140, and an I/O (Input/Output) pad 150. It should be understood that the interface device 100 may include other components, such as a processor, a housing, and/or another I/O pad, although they are not displayed in FIG. 1.

The dynamic tracking bias circuit 110 can provide a first supply voltage VP1.

The first supply voltage VP1 is determined according to the main power voltage VPM and the second supply voltage VP2. For example, the main power voltage VPM and the second supply voltage VP2 may be from an external device (not shown). The ESD clamp circuit 120 can limit the second supply voltage VP2. The post-driver 140 can be driven by the pre-driver 130. The I/O pad 150 can be driven by the post-driver 140. For example, The I/O pad 150 may be implemented with a metal element, which may be used to receive an input voltage or output an output voltage. The pre-driver 130 and the post-driver 140 are supplied by the main power voltage VPM, the first supply voltage VP1, and the second supply voltage VP2.

With such a design, the first supply voltage VP1 can be generated by the dynamic tracking bias circuit 110, rather than any external device. In addition, only the second supply voltage VP2 is limited by the ESD clamp circuit 120, but the first supply voltage VP1 is not limited by any ESD clamp circuit. That is, at least one ESD clamp circuit is omitted in the invention. Therefore, the whole circuit complexity and the overall manufacturing cost of the interface device 100 can be significantly reduced.

The following embodiments will introduce the detailed structures and operations of the interface device 100. It should be understood that these figures and descriptions are merely exemplary, rather than limitations of the invention.

Figure 2:
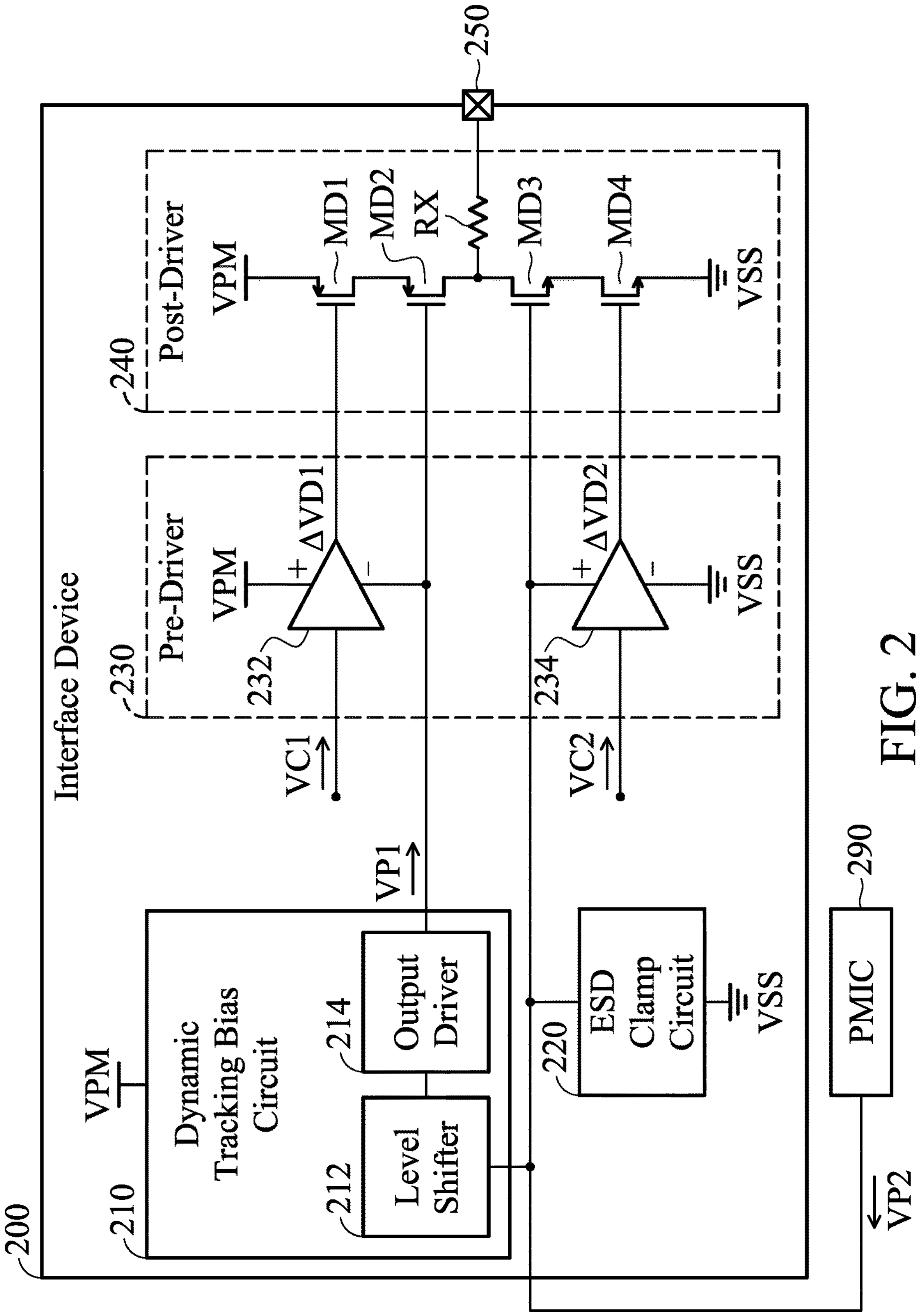
FIG. 2 is a diagram of an interface device according to an embodiment of the invention.

FIG. 2 is a diagram of an interface device 200 according to an embodiment of the invention. FIG. 2 is similar to FIG. 1. In the embodiment of FIG. 2, the interface device 200 includes a dynamic tracking bias circuit 210, an ESD clamp circuit 220, a pre-driver 230, a post-driver 240, and an I/O pad 250. The dynamic tracking bias circuit 210 can provide a first supply voltage VP1. Specifically, the dynamic tracking bias circuit 210 includes a level shifter 212 and an output driver 214. The level shifter 212 can generate the first supply voltage VP1 according to the main power voltage VPM and the second supply voltage VP2. The main power voltage VPM and the second supply voltage VP2 are from an external PMIC (Power Management Integrated Circuit) 290. It should be noted that the PMIC 290 is not any portion of the interface device 200. The output driver 214 can provide a driving capability according to the first supply voltage VP1. For example, if the output driver 214 is implemented by an output buffer, the output driver 214 may buffer and output the first supply voltage VP1. However, the invention is not limited thereto. In alternatively embodiments, the output driver 214 is implemented by an output current driver, such as a dependent current source or a dependent current sink in response to the first supply voltage VP1. It should be noted that the first supply voltage VP1 provided by the dynamic tracking bias circuit 210 is not limited by any ESD clamp circuit.

The ESD clamp circuit 220 is coupled to the level shifter 212 of the dynamic tracking bias circuit 210, and is also coupled to the PMIC 290. The second supply voltage VP2 is limited by the ESD clamp circuit 220.

In some embodiments, the second supply voltage VP2 is higher than or equal to the first supply voltage VP1, and the first supply voltage VP1 is substantially equal to the main power voltage VPM minus the second supply voltage VP2. That is, the relationship between the main power voltage VPM, the first supply voltage VP1, and the second supply voltage VP2 can be described as the following equation (1):

$$VP1 \approx VPM - VP2 \qquad (1)$$

where "VPM" represents the voltage level of the main power voltage VPM, "VP1" represents the voltage level of the first supply voltage VP1, and "VP2" represents the voltage level of the second supply voltage VP2.

The pre-driver 230 includes a high-side circuit 232 and a low-side circuit 234. The types and functions of the high-side circuit 232 and the low-side circuit 234 are not limited in the invention. For example, any of the high-side circuit 232 and the low-side circuit 234 may be implemented with a buffer, a driver, or an amplifier. The high-side circuit 232 is coupled between the main power voltage VPM and the first supply voltage VP1. The high-side circuit 232 may be operated according to a first control voltage VC1. The low-side circuit 234 is coupled between the second supply voltage VP2 and a ground voltage VSS. The low-side circuit 234 may be operated according to a second control voltage VC2. The first control voltage VC1 and the second control voltage VC2 may be generate by another circuit (not shown), such as a processor or a controller, but it is not limited thereto.

The post-driver 240 includes a first driving transistor MD1, a second driving transistor MD2, a third driving transistor MD3, a fourth driving transistor MD4, and a driving resistor RX. For example, each of the first driving transistor MD1 and second driving transistor MD2 may be implemented with a PMOSFET (P-type Metal-Oxide-Semiconductor Field-Effect Transistor), and each of the third driving transistor MD3 and the fourth driving transistor MD4 may be implemented with an NMOSFET (N-type Metal-Oxide-Semiconductor Field-Effect Transistor). The first driving transistor MD1, the second driving transistor MD2, the third driving transistor MD3, and the fourth driving transistor MD4 are coupled in series between the main power voltage VPM and the ground voltage VSS. The second driving transistor MD2 and the third driving transistor MD3 are also coupled through the driving resistor RX to the I/O pad 250. Specifically, a control terminal of the first driving transistor MD1 is controlled by the high-side circuit 232 in response to the first control voltage VC1, a control terminal of the second driving transistor MD2 is used to receive the first supply voltage VP1, a control terminal of the third driving transistor MD3 is used to receive the second supply voltage VP2, and a control terminal of the fourth driving transistor MD4 is controlled by the low-side circuit 234 in response to the second control voltage VC2. It should be understood that the internal circuits of the pre-driver 230 and the post-driver 240 are not limited to the above, and they are adjustable according to different design requirements.

There is a first voltage difference ΔVD1 across the high-side circuit 232. The first voltage difference ΔVD1 is considered as a swing range of the high-side circuit 232. Also, there is a second voltage difference ΔVD2 across the low-side circuit 234. The second voltage difference ΔVD2 is considered as another swing range of the low-side circuit 234. In some embodiments, the first voltage difference ΔVD1 and the second voltage difference ΔVD2 are determined according to the following equations (2) and (3):

$$\Delta VD1 = VPM - VP1 \tag{2}$$

$$\Delta VD2 = VP2 - VSS \tag{3}$$

where "VPM" represents the voltage level of the main power voltage VPM, "VP1" represents the voltage level of the first supply voltage VP1, "VP2" represents the voltage level of the second supply voltage VP2, "VSS" represents the voltage level of the ground voltage VSS, "ΔVD1" represents the first voltage difference ΔVD1, and "ΔVD2" represents the second voltage difference ΔVD2.

According to the equations (2) and (3), the dynamic tracking bias circuit 210 can easily equalize the first voltage difference ΔVD1 and the second voltage difference ΔVD2. For example, the main power voltage VPM may be set to 1.8V, the second supply voltage VP2 may be set to 1.2V, and the ground voltage VSS may be set to 0V. Thus, the first supply voltage VP1 may be equal to 0.6V, and both the first voltage difference ΔVD1 and the second voltage difference ΔVD2 may be equal to 1.2V. With such a design, the overall delay time of the pre-driver 230 can be optimized because the dynamic tracking bias circuit 210 is configured to balance the swing ranges of the high-side circuit 232 and the low-side circuit 234. Other features of the interface device 200 of FIG. 2 are similar to those of the interface device 100 of FIG. 1. Therefore, the two embodiments can achieve similar levels of performance.

Figure 3:
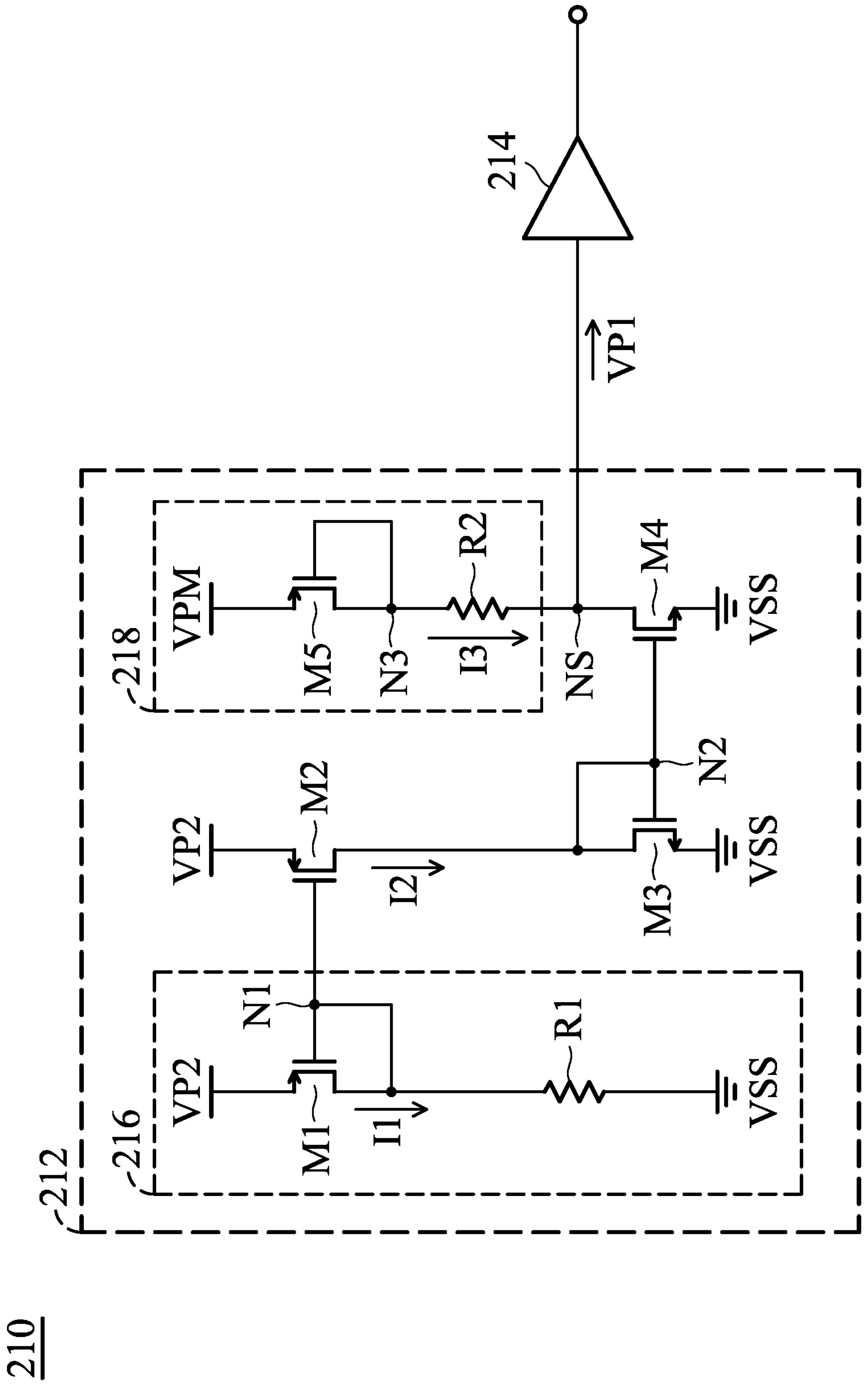
FIG. 3 is a diagram of a detailed structure of a dynamic tracking bias circuit according to an embodiment of the invention.

FIG. 3 is a diagram of the detailed structure of the dynamic tracking bias circuit 210 according to an embodiment of the invention. In the embodiment of FIG. 3, the level shifter 212 of the dynamic tracking bias circuit 210 includes a first transistor M1, a second transistor M2, a third transistor M3, a fourth transistor M4, a fifth transistor M5, a first resistor R1, and a second resistor R2. For example, each of the first transistor M1, the second transistor M2, and the fifth transistor M5 may be implemented with a PMOSFET, and each of the third transistor M3 and the fourth transistor M4 may be implemented with an NMOSFET, but they are not limited thereto . . . .

The first transistor M1 has a control terminal (e.g., a gate) coupled to a first node N1, a first terminal (e.g., a source) coupled to the second supply voltage VP2, and a second terminal (e.g., a drain) coupled to the first node N1. The first resistor R1 has a first terminal coupled to the first node N1, and a second terminal coupled to the ground voltage VSS. The second transistor M2 has a control terminal (e.g., a gate) coupled to the first node N1, a first terminal coupled (e.g., a source) to the second supply voltage VP2, and a second terminal (e.g., a drain) coupled to a second node N2. In some embodiments, the first transistor M1, the second transistor M2, and the fifth transistor M5 have the same transistor sizes (e.g., the same width-to-length ratios, W/L).

The third transistor M3 has a control terminal (e.g., a gate) coupled to the second node N2, a first terminal (e.g., a source) coupled to the ground voltage VSS, and a second terminal (e.g., a drain) coupled to the second node N2. The fourth transistor M4 has a control terminal (e.g., a gate) coupled to the second node N2, a first terminal (e.g., a source) coupled to the ground voltage VSS, and a second terminal (e.g., a drain) coupled to a supply node NS. The supply node NS is arranged to output the first supply voltage VP1 to the output driver 214. In some embodiments, the third transistor M3 and the fourth transistor M4 have the same transistor sizes (e.g., the same width-to-length ratios, W/L).

The second resistor R2 has a first terminal coupled to a third node N3, and a second terminal coupled to the supply node NS. The fifth transistor M5 has a control terminal (e.g., a gate) coupled to the third node N3, a first terminal (e.g., a source) coupled to the main power voltage VPM, and a second terminal (e.g., a drain) coupled to the third node N3. In some embodiments, the first resistor R1 and the second resistor R2 have the same resistances.

In some embodiments, the operational principles of the dynamic tracking bias circuit 210 will be described as follows. A first current mirror is formed by the first transistor M1 and the second transistor M2. Thus, a second current I2 flowing through the second transistor M2 and the third transistor M3 is substantially equal to a first current I1 flowing through the first transistor M1 and the first resistor R1. Similarly, a second current mirror is formed by the third transistor M3 and the fourth transistor M4. Thus, a third current I3 flowing through the fifth transistor M5, the second resistor R2, and the fourth transistor M4 is substantially equal to the second current I2 as mentioned above. Since the third current I3 is substantially equal to the first current I1, the voltage drop caused by the fifth transistor M5 and the second resistor R2 (indicated by a second dashed box 218) can be almost the same as the voltage drop caused by the first transistor M1 and the first resistor R1 (indicated by a first dashed box 216). As a result, the first supply voltage VP1 can be substantially equal to the main power voltage VPM minus the second supply voltage VP2. In alternative embodiments, the dynamic tracking bias circuit 210 is used independently, and it is not necessary to combine the dynamic tracking bias circuit 210 with the interface device 200.

The invention proposes a novel interface device and a novel dynamic tracking bias circuit. Compared to the conventional design, the invention has at least the advantages of suppressing the whole circuit complexity, reducing the overall manufacturing cost, and balancing the high-side and low-side swing ranges, and therefore it is suitable for application in a variety of devices.

Note that the above voltages, currents, resistances, inductances, capacitances and other element parameters are not limitations of the invention. A designer can adjust these settings according to different requirements. The interface device and the dynamic tracking bias circuit of the invention are not limited to the configurations of FIGS. 1-3. The invention may merely include any one or more features of any one or more embodiments of FIGS. 1-3. In other words, not all of the features displayed in the figures should be implemented in the interface device and the dynamic tracking bias circuit of the invention. Although the embodiments of the invention use MOSFET as examples, the invention is not limited thereto, and those skilled in the art may use other types of transistors, such as BJT (Bipolar Junction Transistor), JFET (Junction Gate Field Effect Transistor), FinFET (Fin Field Effect Transistor), etc., without affecting the performance of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An interface device, comprising:

a dynamic tracking bias circuit, providing a first supply voltage, wherein the first supply voltage is determined according to a main power voltage and a second supply voltage;

an ESD (Electrostatic Discharge) clamp circuit, limiting the second supply voltage;

a pre-driver;

a post-driver, driven by the pre-driver; and an I/O (Input/Output) pad, driven by the post-driver;

wherein the pre-driver and the post-driver are supplied by the main power voltage, the first supply voltage, and the second supply voltage;

wherein the dynamic tracking bias circuit comprises:

a level shifter, generating the first supply voltage according to the main power voltage and the second supply voltage; and an output driver, providing a driving capability according to the first supply voltage;

wherein the level shifter of the dynamic tracking bias circuit comprises:

a first transistor, wherein the first transistor has a control terminal coupled to a first node, a first terminal coupled to the second supply voltage, and a second terminal coupled to the first node; and a first resistor, wherein the first resistor has a first terminal coupled to the first node, and a second terminal coupled to a ground voltage.

2. The interface device as claimed in claim 1, wherein the main power voltage and the second supply voltage are from an external PMIC (Power Management Integrated Circuit).

3. The interface device as claimed in claim 1, wherein the first supply voltage is not limited by any ESD clamp circuit.

4. The interface device as claimed in claim 1, wherein the first supply voltage is substantially equal to the main power voltage minus the second supply voltage.

5. The interface device as claimed in claim 1, wherein the level shifter of the dynamic tracking bias circuit further comprises:

a second transistor, wherein the second transistor has a control terminal coupled to the first node, a first terminal coupled to the second supply voltage, and a second terminal coupled to a second node; and a third transistor, wherein the third transistor has a control terminal coupled to the second node, a first terminal coupled to the ground voltage, and a second terminal coupled to the second node.

6. The interface device as claimed in claim 5, wherein the level shifter of the dynamic tracking bias circuit further comprises:

a fourth transistor, wherein the fourth transistor has a control terminal coupled to the second node, a first terminal coupled to the ground voltage, and a second terminal coupled to a supply node;

a second resistor, wherein the second resistor has a first terminal coupled to a third node, and a second terminal coupled to the supply node; and a fifth transistor, wherein the fifth transistor has a control terminal coupled to the third node, a first terminal coupled to the main power voltage, and a second terminal coupled to the third node;

wherein the supply node is arranged to output the first supply voltage to the output driver.

7. The interface device as claimed in claim 6, wherein the first transistor, the second transistor, and the fifth transistor have same transistor sizes.

8. The interface device as claimed in claim 6, wherein each of the first transistor, the second transistor, and the fifth transistor is implemented with a PMOSFET (P-type Metal-Oxide-Semiconductor Field-Effect Transistor).

9. The interface device as claimed in claim 6, wherein the third transistor and the fourth transistor have same transistor sizes.

10. The interface device as claimed in claim 6, wherein each of the third transistor and the fourth transistor is implemented with an NMOSFET (N-type Metal-Oxide-Semiconductor Field-Effect Transistor).

11. A dynamic tracking bias circuit, comprising:

a level shifter, generating a first supply voltage according to a main power voltage and a second supply voltage; and an output driver, providing a driving capability according to the first supply voltage;

wherein the first supply voltage is substantially equal to the main power voltage minus the second supply voltage;

wherein the level shifter of the dynamic tracking bias circuit comprises:

a first transistor, wherein the first transistor has a control terminal coupled to a first node, a first terminal coupled to the second supply voltage, and a second terminal coupled to the first node; and a first resistor, wherein the first resistor has a first terminal directly connected to the first node, and a second terminal coupled to a ground voltage.

12. The dynamic tracking bias circuit as claimed in claim 11, wherein the level shifter of the dynamic tracking bias circuit further comprises:

a second transistor, wherein the second transistor has a control terminal coupled to the first node, a first terminal coupled to the second supply voltage, and a second terminal coupled to a second node; and a third transistor, wherein the third transistor has a control terminal coupled to the second node, a first terminal coupled to the ground voltage, and a second terminal coupled to the second node.

13. The dynamic tracking bias circuit as claimed in claim 12, wherein the level shifter of the dynamic tracking bias circuit further comprises:

a fourth transistor, wherein the fourth transistor has a control terminal coupled to the second node, a first terminal coupled to the ground voltage, and a second terminal coupled to a supply node;

a second resistor, wherein the second resistor has a first terminal coupled to a third node, and a second terminal coupled to the supply node; and a fifth transistor, wherein the fifth transistor has a control terminal coupled to the third node, a first terminal coupled to the main power voltage, and a second terminal coupled to the third node;

wherein the supply node is arranged to output the first supply voltage to the output driver.

14. The dynamic tracking bias circuit as claimed in claim 13, wherein the first transistor, the second transistor, and the fifth transistor have same transistor sizes.

15. The dynamic tracking bias circuit as claimed in claim 13, wherein each of the first transistor, the second transistor, and the fifth transistor is implemented with a PMOSFET (P-type Metal-Oxide-Semiconductor Field-Effect Transistor).

16. The dynamic tracking bias circuit as claimed in claim 13, wherein the third transistor and the fourth transistor have same transistor sizes.

17. The dynamic tracking bias circuit as claimed in claim 13, wherein each of the third transistor and the fourth transistor is implemented with an NMOSFET (N-type Metal-Oxide-Semiconductor Field-Effect Transistor).

* * * * *